United States Patent
Dawson

(10) Patent No.: US 9,102,514 B2
(45) Date of Patent: Aug. 11, 2015

(54) INHIBITING PROPAGATION OF SURFACE CRACKS IN A MEMS DEVICE

(71) Applicant: FREESCALE SEMICONDUCTOR, INC., Austin, TX (US)

(72) Inventor: Chad S. Dawson, Queen Creek, AZ (US)

(73) Assignee: FREESCALE SEMICONDUCTOR, INC, Austin, TX (US)

( * ) Notice: Subject to any disclaimer, the term of this patent is extended or adjusted under 35 U.S.C. 154(b) by 70 days.

(21) Appl. No.: 13/848,819

(22) Filed: Mar. 22, 2013

(65) Prior Publication Data

US 2014/0287547 A1  Sep. 25, 2014

(51) Int. Cl.
 *H01L 29/84* (2006.01)
 *B81B 3/00* (2006.01)

(52) U.S. Cl.
 CPC ......... *B81B 3/0078* (2013.01); *B81C 2201/017* (2013.01)

(58) Field of Classification Search
 CPC ............... H01L 21/31053; H01L 21/31055; H01L 21/32055
 USPC ........... 438/50, 488, 149, 253, 396, 427, 492; 257/306, 506, 627, 64
 See application file for complete search history.

(56) References Cited

U.S. PATENT DOCUMENTS

| | | | | |
|---|---|---|---|---|
| 4,742,020 A | * | 5/1988 | Roy | 438/149 |
| 5,494,857 A | | 2/1996 | Cooperman et al. | |
| 6,147,397 A | * | 11/2000 | Burns et al. | 257/669 |
| 2001/0002710 A1 | | 6/2001 | Roberts et al. | |
| 2011/0049648 A1 | * | 3/2011 | Geisberger | 257/415 |
| 2012/0139064 A1 | * | 6/2012 | Nakatani et al. | 257/415 |

FOREIGN PATENT DOCUMENTS

WO  2005044720 A1  5/2005

* cited by examiner

*Primary Examiner* — Roy Potter
*Assistant Examiner* — Damian A Hillman
(74) *Attorney, Agent, or Firm* — Charlene R. Jacobsen

(57) ABSTRACT

A microelectromechanical systems (MEMS) device (58) includes a structural layer (78) having a top surface (86). The top surface (86) includes surface regions (92, 94) that are generally parallel to one another but are offset relative to one another such that a stress concentration location (90) is formed between them. Laterally propagating shallow surface cracks (44) have a tendency to form in the structural layer (78), especially near the joints (102) between the surface regions (92, 94). A method (50) entails fabricating (52) the MEMS device (58) and forming (54) trenches (56) in the top surface (86) of the structural layer (78) of the MEMS device (58). The trenches (56) act as a crack inhibition feature to largely prevent the formation of deep cracks in structural layer (78) which might otherwise result in MEMS device failure.

19 Claims, 4 Drawing Sheets

INHIBITING PROPAGATION OF SURFACE CRACKS IN A MEMS DEVICE

TECHNICAL FIELD OF THE INVENTION

The present invention relates generally to microelectromechanical systems (MEMS) devices. More specifically, the present invention relates to methodology for inhibiting the propagation of cracks in the surface of a MEMS device.

BACKGROUND OF THE INVENTION

Microelectromechanical Systems (MEMS) devices are widely used in applications such as automotive, inertial guidance systems, household appliances, protection systems for a variety of devices, cellular communication devices, and many other industrial, scientific, and engineering systems. Some MEMS devices may be used to sense a physical condition such as acceleration, pressure, angular rotation, or temperature, and to provide an electrical signal representative of the sensed physical condition to the applications and/or systems employing the MEMS sensors. Other MEMS devices may be utilized as actuators, switches, pumps, and so forth.

BRIEF DESCRIPTION OF THE DRAWINGS

A more complete understanding of the present invention may be derived by referring to the detailed description and claims when considered in connection with the Figures (not necessarily drawn to scale), wherein like reference numbers refer to similar items throughout the Figures, and:

DETAILED DESCRIPTION

Numerous MEMS devices have been developed which use polycrystalline silicon (polysilicon) as a primary structural material. It has been observed, however, that polysilicon can crack during MEMS device fabrication, as well as under potentially severe mechanical and environmental loading conditions. The cracks tend to form at the polysilicon surface and propagate a relatively long distance laterally across the surface of the polysilicon before propagating deeply into the polysilicon material, resulting in MEMS device failure.

Figure 1:
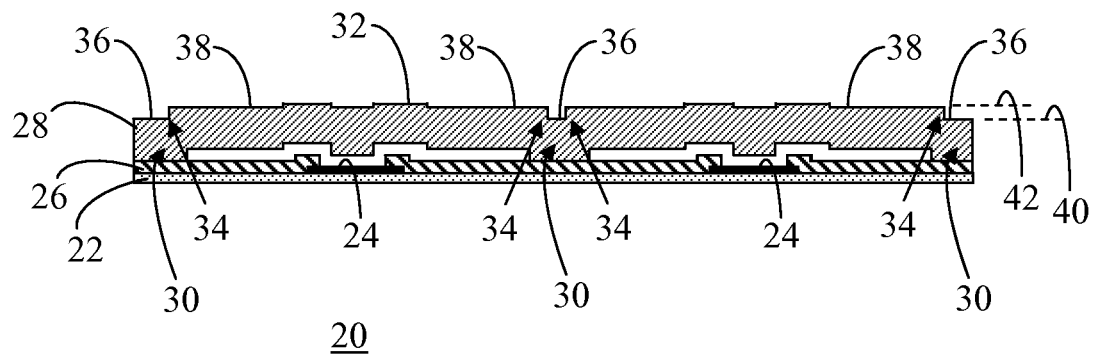
FIG. 1 shows a side view of a portion of a MEMS device.
Figure 2:
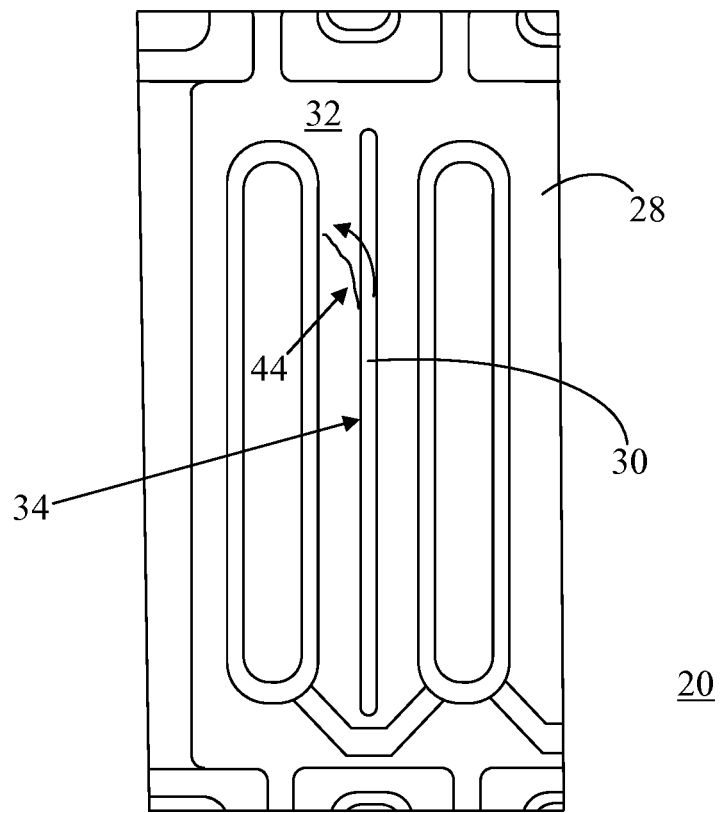
FIG. 2 shows an enlarged top view of a portion of the MEMS device.

Referring to FIGS. 1 and 2, FIG. 1 shows a side view of a portion of an exemplary MEMS device 20, and FIG. 2 shows an enlarged top view of a portion of MEMS device 20. In this example, MEMS device 20 may be formed by depositing, patterning, and etching a series of layers onto an underlying substrate 22. For example, MEMS device 20 may include electrodes 24 formed on substrate 22, a layer of nitride film 26, and a polysilicon structural layer 28, each of which are suitably patterned and etched to yield MEMS device 20. In some devices, polysilicon structural layer 28 may be suspended above, i.e., separated by an air or vacuum gap from, the underlying electrodes 24 and/or nitride film 26. In such a design, polysilicon structural layer 28 interconnects to the underlying material layers at anchor regions 30 or by a system of anchors and springs (not shown). In other devices, additional material layers may be formed on top of polysilicon structural layer 28.

Due to the conventional surface micromachining processes, of deposition, patterning, and etching, a top surface 32 of polysilicon structural layer 28 may not lie in one plane. That is, top surface 32 may not be flat or planar. For example, a step-down 34 may occur at the intersection of a surface region 36 and a surface region 38 of top surface 32 near anchor regions 30. Step-down 34 represents an inconsistency, i.e., a change in planarity of top surface 32. As such, surface region 36 may generally lie in a plane 40 and surface region 38 may generally lie generally in a plane 42 that is parallel to, but is offset from, plane 40.

It has been observed that surface cracks 44 (one shown in FIG. 2) tend to initiate at top surface 32 of polysilicon structural layer 28 near anchor regions 30. Unfortunately, these surface cracks 44 can propagate toward the suspended structures within polysilicon structural layer 28 of MEMS device 20. Surface cracks 44 may tend to initiate at anchor regions 30 because the nonplanar surface topology of top surface 32 creates a tensile stress concentration point. In general, surface cracks 44 can start when the tensile stress exceeds the material strength. In addition, the grain structure of polysilicon structural layer 28 may not be cohesive around the anchor regions 30. The merging of two different grain orientations of polysilicon can result in a seam at the anchor edge, i.e., at step-downs 34, that may be weaker than the rest of polysilicon structural layer 28.

Unfortunately, polysilicon cracking can result in a yield loss. In some examples, the yield loss can run around approximately five percent. Tests may be run on MEMS devices to detect cracks in the polysilicon. While testing might be viewed as a practical solution to reliability assurance of MEMS devices, the cost for developing effective and reliable testing remains high, which ultimately increases the cost for the MEMS devices. Furthermore, the tests may not be one hundred percent effective at detecting polysilicon cracks. Thus, some MEMS devices can still get shipped into the field, resulting in customer returns of the cracked units.

Embodiments described herein entail methodology for fabricating a MEMS device by incorporating features for inhibiting the propagation of surface cracks in the MEMS device, and a MEMS device that includes features that inhibit the propagation of cracks in its polysilicon surface. Such methodology and MEMS device structure can result in reduced tests costs, MEMS device yield improvement, and improved quality and reliability of the MEMS devices in the field.

Figure 3:
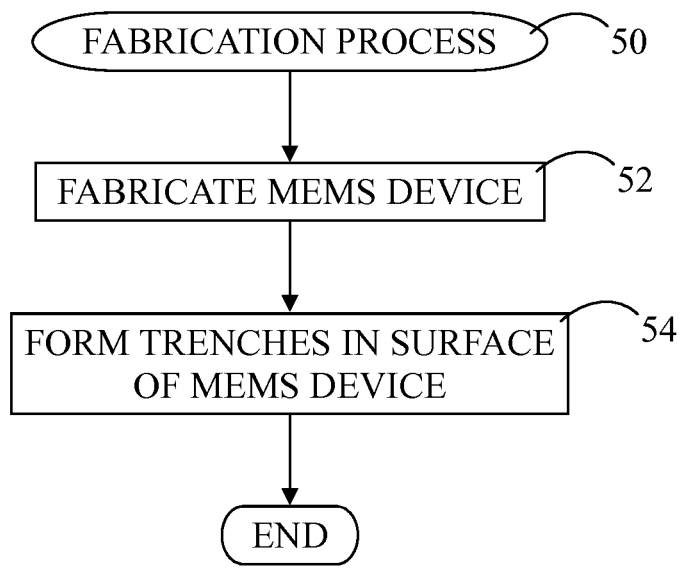
FIG. 3 shows a flowchart of a fabrication process for fabricating a MEMS device incorporating features for inhibiting the propagation of surface cracks in the MEMS device in accordance with an embodiment.

FIG. 3 shows a flowchart of a fabrication process 50 for fabricating a MEMS device incorporating features for inhibiting the propagation of surface cracks in the MEMS device in accordance with an embodiment. The various method steps depicted in FIG. 3 will be described in more detail below in connection with FIGS. 4-11. Accordingly, the following discussion of fabrication process 50 should be considered a summary of the method, and the various embodiment details discussed below in connection with FIGS. 4-11 apply to the discussion of the method steps of FIG. 3.

In general, the method begins, at a task 52, at which a MEMS device is fabricated. The MEMS device may be MEMS device 20 mentioned above, or any other MEMS device design in which surface cracking of a polysilicon structural layer may occur. Next, at a task 54, trenches are formed in the surface of the MEMS device. FIGS. 4-9 generally show schematic cross-sectional views illustrating a number of MEMS operations encompassed within the summary task 52 of fabrication process 50, and FIGS. 10-11 generally show schematic cross-sectional views illustrating trenches 56 (see FIGS. 10-11) formed in a MEMS device 58 (see FIGS. 10-11) in accordance with the operations encompassed within the summary task 54 of fabrication process 50.

The trenches may be formed by implementing a suitable manufacturing process, such as by etching, although the particular trench formation manufacturing process is not a limitation. The trenches are formed anywhere in the surface of the polysilicon structural layer at stress concentration points at which cracks may likely initiate in the future, such as at the location of step-downs 34 (FIG. 1) or step-ups. The trenches may allow small, i.e., relatively short, surface cracks to form. However, suitably arranged trenches largely prevent the small surface cracks from propagating laterally far enough to cause MEMS device failure. Following the formation of the trenches at task 54, MEMS device fabrication process 50 ends. Of course, there may be additional operations prior to the completion of MEMS device fabrication process 50 that are omitted herein for brevity.

Figure 4:
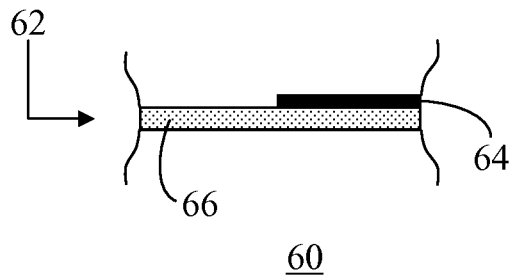
FIG. 4 shows a partial cross-sectional view of a structure at an initial stage of manufacture for producing a MEMS device having features incorporated therein for inhibiting the propagation of surface cracks.

Referring now to FIG. 4, FIG. 4 shows a partial cross-sectional view of a structure 60 at an initial stage 62 of manufacture for producing a MEMS device, e.g., MEMS device 58 (FIG. 10), having features incorporated therein for inhibiting the propagation of surface cracks 44 (FIG. 2). Different shading and/or hatching is utilized in the illustrations to distinguish the different material layers and/or the different elements within the structural layers.

In general, at initial stage 62, a polysilicon layer 64 is deposited on a substrate 66 and patterned using, for example, a photolithographic process, and etched using, for example, reactive ion etching (RIE). A high conductivity may be desired for polysilicon layer 64 in some embodiments. Hence, polysilicon layer 64 may be doped over the entire surface area, or may otherwise be made highly conductive to yield, for example, electrodes (such as electrodes 24 shown in FIG. 1). Those skilled in the art will readily recognize that prior to initial stage 62 at which polysilicon layer 60 is formed over substrate 66, various surface preparation operations may be performed that are omitted herein for brevity.

Figure 5:
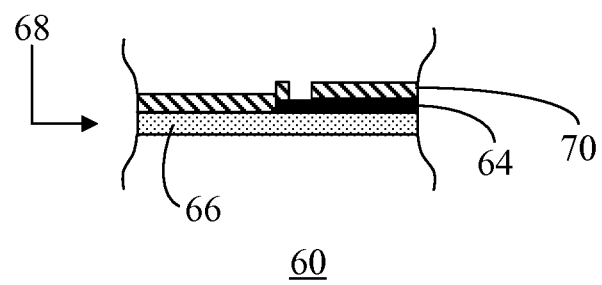
FIG. 5 shows a partial cross-sectional view of the structure of FIG. 4 at a subsequent stage of processing.

FIG. 5 shows a partial cross-sectional view of structure 60 at a subsequent stage 68 of processing. At stage 68, nitride 70 is deposited over polysilicon layer 64 as well as any exposed portions of substrate 66. Nitride 70 may be patterned using, for example, a photolithographic process, and etched using, for example, RIE, to produce a patterned nitride layer. Nitride 70 insulates various regions of polysilicon layer 64 from one another.

Figure 6:
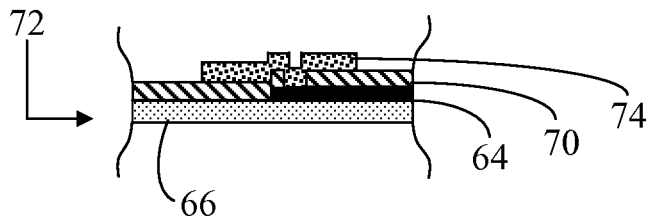
FIG. 6 shows a partial cross-sectional view of the structure of FIG. 5 at a subsequent stage of processing.

FIG. 6 shows a partial cross-sectional view of structure 60 at a subsequent stage 72 of processing. At stage 72, a sacrificial oxide 74 is deposited over substrate 66, polysilicon layer 64, and nitride 70. Sacrificial oxide 74 may then be patterned using, for example, a photolithographic process, and etched using, for example, an oxide wet etch process.

Figure 7:
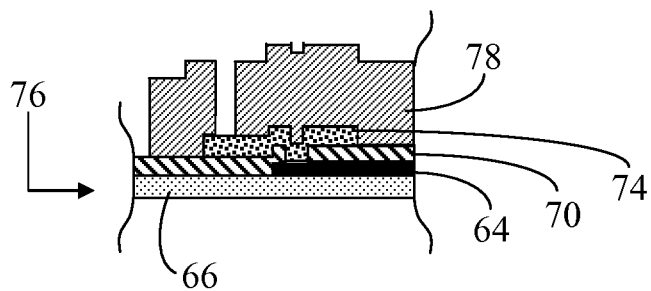
FIG. 7 shows a partial cross-sectional view of the structure of FIG. 6 at a subsequent stage of processing.

FIG. 7 shows a partial cross-sectional view of structure 60 at a subsequent stage 76 of processing. At stage 76, thick polysilicon deposition is performed. As shown, a polysilicon structural layer 78 is formed overlying the various structures previously built up on substrate 66. Polysilicon structural layer 78, including any openings extending through layer 78, may be suitably formed using various processes for thick film deposition, patterning, and etching.

Figure 8:
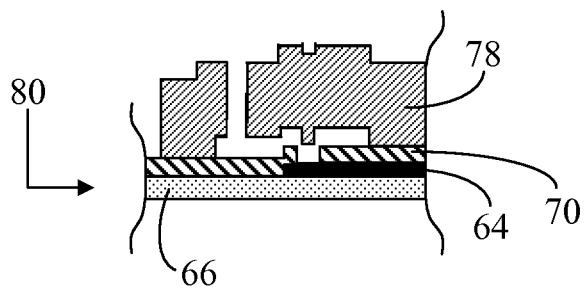
FIG. 8 shows a partial cross-sectional view of the structure of FIG. 7 at a subsequent stage of processing.

FIG. 8 shows a partial cross-sectional view of structure 60 at a subsequent stage 80 of processing. At stage 80, etching is performed to remove sacrificial layer 74, which was illustrated in FIGS. 6 and 7, but is no longer visible in FIG. 8. Following removal of sacrificial layer 74, the microstructures of MEMS device 58 (FIG. 10) are released and are spaced apart from the underlying substrate 66, polysilicon layer 64, and nitride 70. Accordingly, any movable structures (not expressly labeled) of MEMS device 58 are now movably suspended in accordance with a particular design of MEMS device 58.

Figure 9:
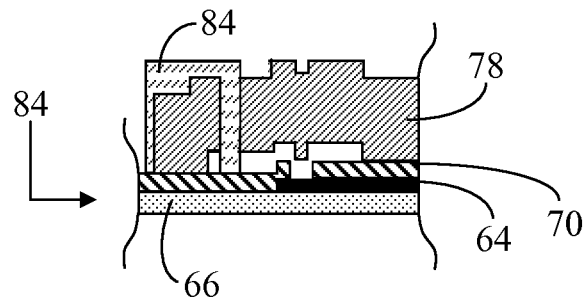
FIG. 9 shows a partial cross-sectional view of the structure of FIG. 8 at a subsequent stage of processing.

FIG. 9 shows a partial cross-sectional view of structure 60 at a subsequent stage 82 of processing. At stage 82, a sealing material 84, e.g., a packaging material, may be deposited over portions of structure 60 to seal otherwise protect at least portions of structure 60 from the external environment. However, remaining portions of structure 60 may not be encapsulated in sealing material 84 when the movable microstructures are to be exposed to an external environment in order to detect an external stimulus (e.g., pressure).

FIGS. 4-9 are discussed in connection with surface micromachining operations implemented to form a MEMS device. It is to be understood that certain operations depicted in FIGS. 4-9 may be performed in parallel with each other or with performing other processes, or may be omitted in accordance with particular MEMS device fabrication methodologies. Furthermore, the particular deposition, patterning, and etching techniques mentioned herein are not a limitation. Rather, any suitable technique for deposition, patterning, etching, and so forth may be implemented in accordance with alternative embodiments. In addition, it is to be understood that the particular ordering of the operations depicted in connection with FIGS. 4-9 may be modified, while achieving substantially the same result.

Figure 10:
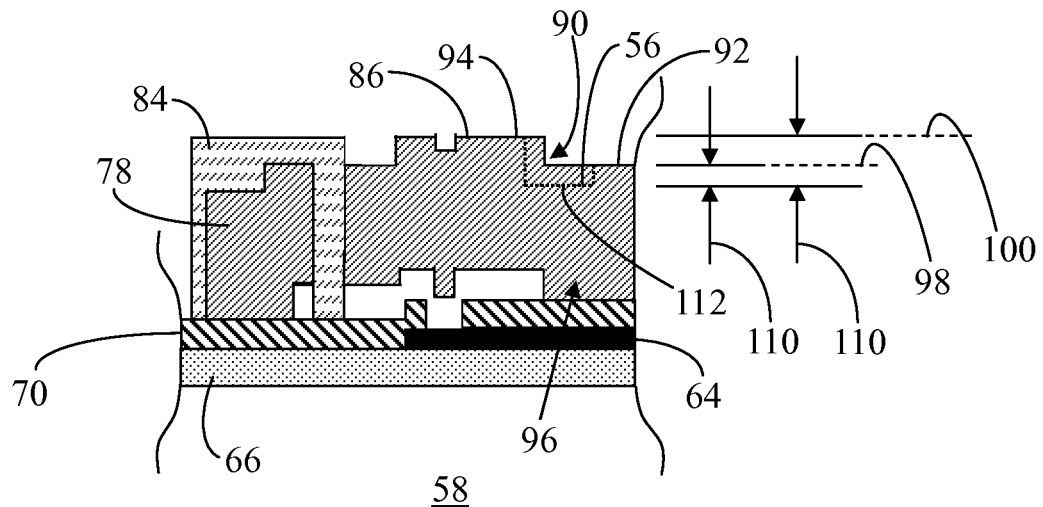
FIG. 10 shows a partial cross-sectional view of a MEMS device fabricated from the structure of FIGS. 4-9 having features formed therein that inhibit the propagation of cracks in the surface of the MEMS device.
Figure 11:
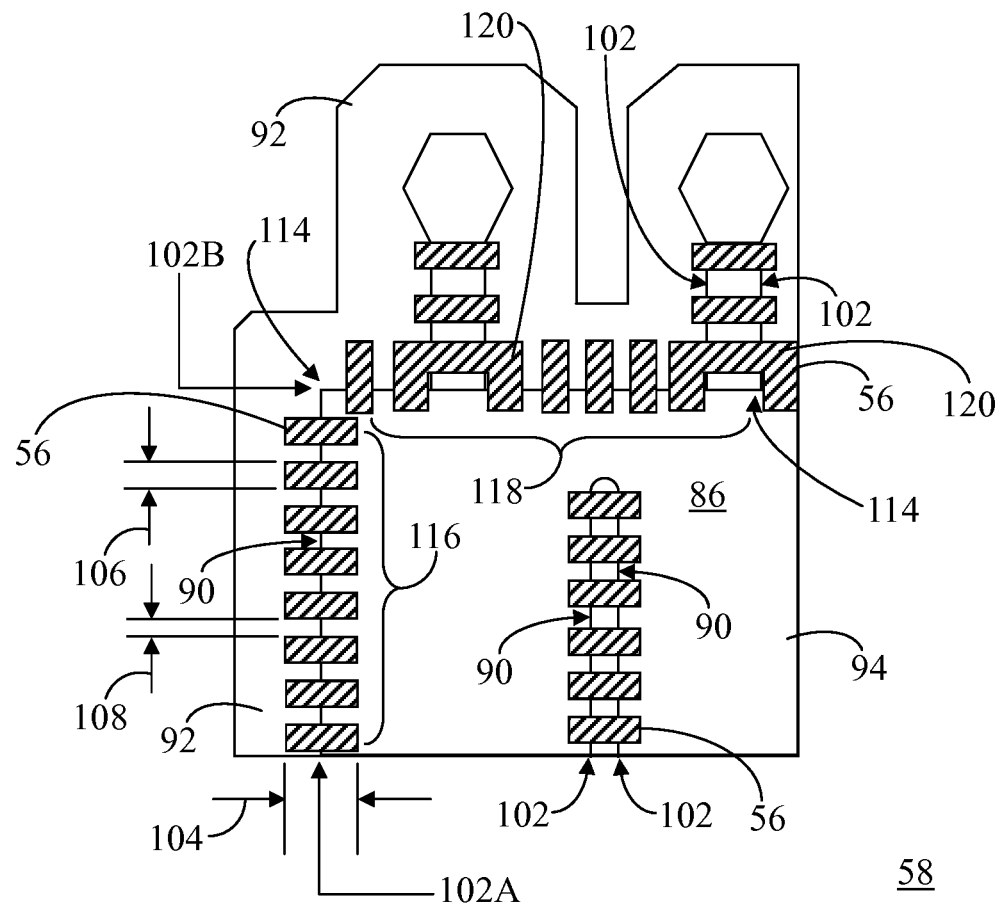
FIG. 11 shows an enlarged partial top view of the MEMS device of FIG. 10.

Referring now to FIGS. 10-11, FIG. 10 shows a partial cross-sectional view of MEMS device 58 fabricated from structure 60 having features formed therein that inhibit the propagation of cracks in a top surface 86 of MEMS device 58, and FIG. 11 shows an enlarged partial top view of MEMS device 58. In accordance with block 54 (FIG. 3) of fabrication process 50 (FIG. 3), trenches 56 are formed in a top surface 86 of MEMS device 58. In FIG. 10, trenches 56 are represented in dashed line form extending into top surface 86. In FIG. 11, trenches 56 are illustrated using rightwardly and upwardly wide hatching to distinguish them from the surrounding top surface 86 of polysilicon structural layer 78.

Due to the surface micromachining processes, of deposition, patterning, and etching as shown above, top surface 86 of polysilicon structural layer 78 may not lie in one plane. That is, top surface 86 may not be flat or planar. In this example, a step-down 90 may occur at the intersection of a surface region 92 and a surface region 94 of top surface 86 near anchor regions 96 (one being visible in FIG. 10). As such, surface region 92 lies generally in a plane 98 and surface region 94 lies generally in a plane 100 that is parallel to, but is offset from, plane 98. In the illustrated embodiment, surface region 94 extends upwardly from surface region 92. The intersection of surface regions 92 and 94 is a tensile stress concentration location where polysilicon structural layer 78 may crack during fabrication or in the future. Of course, other step-down regions and/or other tensile stress concentration location may be present in top surface 86.

Trenches 56 are formed in top surface 86 of polysilicon structural layer 78. In particular, trenches 56 are formed across one or more longitudinal joints 102 between surface regions 92 and 94, and extend into each of surface regions 92 and 94. Trenches 56 may be formed by etching, saw cutting, or any other suitable technique. In an embodiment, a length 104 of each of trenches 56 is oriented approximately perpendicular to the longitudinal joint 102 across which it spans. Thus, trenches 56 spanning the same one of longitudinal joints 102 are parallel to one another. In some embodiments, length 104 of each of trenches 56 is in a range of three to seven microns, and a width 106 of each of trenches 56 is in a range of three to five microns into top surface 86. A spacing 108 between adjacent trenches 56 may also be in a range of three to five microns. In an embodiment, width 106 and spacing 108 are as small as can be manufactured.

In general, shallow surface cracks 44 (FIG. 2) have been observed to be less than 0.25 microns deep. Accordingly, trenches 56 are formed to extend into top surface 86 by a depth 110 in a range of 0.25-0.75 microns. In this example embodiment, trenches 56 may extend into surface region 92 by approximately 0.5 microns and trenches 56 may extend into surface region 94 by 0.5 microns plus the height of surface region 94 above surface region 92 (e.g., 0.25 microns). In some embodiments, depth 110 can be any suitable amount such that a bottom surface 112 of trench 56 extending across longitudinal joint 102 and into surface regions 92 and 94 may be generally flat, i.e., is without step-downs or step-ups. In other embodiments, bottom surface 112 of trench 56 may be uneven as a result of a particular etch process used, e.g., an isotropic etch process.

In some embodiments, one of longitudinal joints 102 is continuous with another one of longitudinal joints 102, but they are oriented out of alignment with one another, i.e., nonparallel relative to one another. Such a configuration can occur at certain corners 114 of surface regions 92 and 94 of top surface 86. Accordingly, a subset 116 of trenches 56 may extend across one of longitudinal joints 102, e.g., a longitudinal joint 102A, oriented perpendicular to that longitudinal joint 102A, and another subset 118 of trenches 56 may extend across the other longitudinal joint 102, oriented perpendicular to that longitudinal joint 102. As such, trenches 56 extending across longitudinal joints 102 that are out of alignment (nonparallel) relative to one another will likewise be out of alignment (nonparallel) relative to one another. In some embodiments, these nonparallel trenches 56 in close proximity with one another may intersect to form a contiguous, i.e., single, extended trench 120 having a portion that is perpendicular to the longitudinal joint 102 that it spans and having another portion that is perpendicular to the longitudinal joint 102 that it spans.

The multiple trenches 56 are formed anywhere in top surface 86 of polysilicon structural layer 78 where surface cracks 44 (FIG. 2) may be likely to form in top surface 86 of polysilicon structural layer 78. In some embodiments, the surface of trenches 56 may be filled with a packaging material, i.e., an encapsulant. Nevertheless, when trenches 56 are located near anchor regions 96, small (relatively short), shallow surface cracks 44 may be allowed to form. However, the presence of trenches 56 prohibits the short surface cracks 44 from propagating laterally where they could go deep enough to breach the suspended structures and cause MEMS device failure. Thus, trenches 56 can limit the length of the propagation path of shallow surface cracks 44.

Embodiments described herein entail methodology for fabricating a MEMS device by incorporating trench features that can inhibit the propagation of surface cracks in the MEMS device, and a MEMS device that includes the trench features. Although particular trench configurations are described above, MEMS devices may include trench features having other shapes, depths, orientations, locations, and so forth. These and other variations are intended to be included within the scope of the inventive subject matter. Such methodology and MEMS device having trenches formed therein can result in reduced tests costs, MEMS device yield improvement, and improved quality and reliability of the MEMS devices in the field.

While the principles of the inventive subject matter have been illustrated and described above in connection with specific devices and methods, it is to be clearly understood that this description is made only by way of example and not as a limitation on the scope of the inventive subject matter. The foregoing description of specific embodiments reveals the general nature of the subject matter sufficiently so that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and scope of the appended claims.

What is claimed is:

1. A method comprising:
   fabricating a microelectromechanical systems (MEMS) device that includes a structural layer having a surface, said surface including a first surface region and a second surface region adjacent to said first surface region, said first surface region lying in a first plane that is offset from a second plane of said second surface region, said second plane being substantially parallel to said first plane, said surface including at least one stress concentration location, said at least one stress concentration location including a longitudinal joint between said first and second surface regions; and
   forming at least one trench in said surface of said structural layer across said stress concentration location such that said at least one trench is formed in said surface of said structural layer across said longitudinal joint.

2. A method as claimed in claim 1 wherein said at least one trench extends into each of said first and second surface regions.

3. A method as claimed in claim 1 wherein said at least one trench exhibits a length and a width, said length being greater than said width, and said length of said at least one trench is oriented approximately perpendicular to said longitudinal joint.

4. A method as claimed in claim 1 wherein said longitudinal joint is a first longitudinal joint, said MEMS device includes a second longitudinal joint between said first and second surface regions, said second longitudinal joint being contiguous with said first longitudinal joint, said second longitudinal joint being in nonparallel alignment with said first longitudinal joint section, and said forming operation comprises:

forming a first one of said at least one trench extending across said first longitudinal joint; and forming a second one of said at least one trench extending across said second longitudinal joint, said second trench being in said nonparallel alignment with said first trench.

5. A method as claimed in claim 4 wherein:
said first trench is oriented approximately perpendicular to said first longitudinal joint; and
said second trench is oriented approximately perpendicular to said second longitudinal joint.

6. A method as claimed in claim 4 wherein said first and second trenches form a contiguous extended trench.

7. A method as claimed in claim 1 wherein said at least one trench extends into said surface by a depth, said depth being in a range of 0.25 to 0.75 microns.

8. A method as claimed in claim 1 wherein said at least one trench exhibits a length and a width, said length being greater than said width, and said length being in a range of three to seven microns.

9. A method as claimed in claim 1 wherein said at least one trench exhibits a length and a width, said length being greater than said width, and said width being in a range of three to five microns.

10. A method as claimed in claim 1 wherein said forming operation comprises forming a plurality of trenches extending across said stress concentration location.

11. A method as claimed in claim 10 wherein said trenches of said plurality of trenches are oriented approximately parallel to one another.

12. A method as claimed in claim 10 wherein adjacent trenches of said plurality of trenches are separated from one another by a spacing, said spacing being in a range of three to five microns.

13. A method as claimed in claim 1 wherein said structural layer is a polysilicon layer.

14. A method comprising:
fabricating a microelectromechanical systems (MEMS) device, said MEMS device including a polysilicon structural layer, said polysilicon structural layer having a surface, said surface including a first surface region and a second surface region adjacent to said first surface region, said first surface region lying in a first plane that is offset from a second plane of said second surface region, said second plane being substantially parallel to said first plane; and
forming a plurality of trenches in said surface of said polysilicon structural layer across a longitudinal joint between said first and second surface regions, each of said trenches of said plurality of trenches extending into said first and second surface regions by a depth.

15. A method as claimed in claim 14 wherein said depth is in a range of 0.25 to 0.75 microns.

16. A method comprising:
fabricating a microelectromechanical systems (MEMS) device that includes a structural layer having a surface, said surface including a first surface region and a second surface region adjacent to said first surface region, said first surface region lying in a first plane that is offset from a second plane of said second surface region, said second plane being substantially parallel to said first plane, said surface including at least one stress concentration location, said at least one stress concentration location including a longitudinal joint between said first and second surface regions; and
forming a plurality of trenches in said surface of said structural layer extending across said longitudinal joint, each of said trenches extending into each of said first and second surface regions, wherein adjacent ones of said trenches extending across said longitudinal joint are oriented approximately parallel to one another.

17. A method as claimed in claim 16 wherein each of said trenches exhibits and length and a width, said length being greater than said width, and said length of said each of said trenches is oriented approximately perpendicular to said longitudinal joint.

18. A method as claimed in claim 16 wherein said longitudinal joint is a first longitudinal joint, said MEMS device includes a second longitudinal joint between said first and second surface regions, said second longitudinal joint being contiguous with said first longitudinal joint, said second longitudinal joint being in nonparallel alignment with said first longitudinal joint section, and said forming operation comprises:
forming a first one of said plurality of trenches extending across said first longitudinal joint; and
forming a second one of said plurality of trenches extending across said second longitudinal joint, said second trench being in said nonparallel alignment with said first trench, and said first and second trenches forming a contiguous extended trench.

19. A method as claimed in claim 18 wherein:
said first trench is oriented approximately perpendicular to said first longitudinal joint; and
said second trench is oriented approximately perpendicular to said second longitudinal joint.

* * * * *